United States Patent
Ashihara et al.

(10) Patent No.: US 9,824,883 B2
(45) Date of Patent: Nov. 21, 2017

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: HITACHI KOKUSAI ELECTRIC INC., Tokyo (JP)

(72) Inventors: Hiroshi Ashihara, Toyama (JP); Arito Ogawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 2 days.

(21) Appl. No.: 14/805,104

(22) Filed: Jul. 21, 2015

(65) Prior Publication Data

US 2015/0340226 A1 Nov. 26, 2015

Related U.S. Application Data

(62) Division of application No. 14/201,017, filed on Mar. 7, 2014, now abandoned.

(30) Foreign Application Priority Data

Dec. 27, 2013 (JP) .................................. 2013-271927

(51) Int. Cl.
  *C23C 16/455* (2006.01)
  *H01L 21/02* (2006.01)
  (Continued)

(52) U.S. Cl.
  CPC .... *H01L 21/02271* (2013.01); *C23C 16/4405* (2013.01); *C23C 16/4412* (2013.01);
  (Continued)

(58) Field of Classification Search
  CPC ................................................... C23C 16/455
  See application file for complete search history.

(56) References Cited

U.S. PATENT DOCUMENTS 5,711,813 A    1/1998  Kadoiwa et al.
7,918,938 B2 *  4/2011  Provencher ....... C23C 16/45536
                                               118/715

(Continued)

FOREIGN PATENT DOCUMENTS

JP    H06-053780 U    7/1994
JP    H08-260158 A    10/1996

(Continued)

OTHER PUBLICATIONS

Taiwanese Notification of First Office Action, TW Patent Application No. 10-3105764, dated Sep. 17, 2015, 9 pgs. (English translation provided).

(Continued)

*Primary Examiner* — Elizabeth Burkhart
(74) *Attorney, Agent, or Firm* — Volpe and Koenig, P.C.

(57) ABSTRACT

A method of manufacturing a semiconductor device by processing a substrate by supplying a processing space with a gas dispersed in a buffer space disposed at an upstream side of the processing space is provided. The method includes (a) transferring the substrate into the processing space while exhausting a transfer space of the substrate by a first vacuum pump; (b) closing a first valve disposed at a downstream side of the first vacuum pump; (c) supplying the gas into the processing space via the buffer space; and (d) exhausting the buffer space through an exhaust pipe connected to a downstream side of the first valve.

5 Claims, 6 Drawing Sheets

(51) Int. Cl.
C23C 16/44 (2006.01)
H01L 21/67 (2006.01)
(52) U.S. Cl.
CPC ........ *C23C 16/455* (2013.01); *H01L 21/0228* (2013.01); *H01L 21/02104* (2013.01); *H01L 21/02164* (2013.01); *H01L 21/02211* (2013.01); *H01L 21/02219* (2013.01); *H01L 21/02274* (2013.01); *H01L 21/67017* (2013.01)

(56) References Cited

U.S. PATENT DOCUMENTS

| | | | |
|---|---|---|---|
| 2005/0229848 A1* | 10/2005 | Shinriki | C23C 16/34 118/715 |
| 2013/0000558 A1* | 1/2013 | Hara | C23C 16/16 118/724 |
| 2013/0012033 A1 | 1/2013 | Kabe et al. | |

FOREIGN PATENT DOCUMENTS

| | | |
|---|---|---|
| JP | H09-195976 A | 7/1997 |
| JP | 11-300193 A | 11/1999 |
| JP | 2005-303292 A | 10/2005 |
| JP | 2009-524244 A | 6/2009 |
| JP | 2009-176799 A | 8/2009 |
| KR | 10-2004-0096317 A | 11/2004 |
| KR | 10-2005-0034567 A | 4/2005 |

OTHER PUBLICATIONS

Notice of Reasons for Rejection, KR Patent Application No. 10-2014-0021953, dated Jan. 5, 2016, 15 pages (English translation provided).

JP Office Action for JP Patent Application No. 2014-069342, dated Jul. 31, 2015, 4 pgs.

* cited by examiner

SUBSTRATE PROCESSING APPARATUS, METHOD OF MANUFACTURING SEMICONDUCTOR DEVICE, AND NON-TRANSITORY COMPUTER-READABLE RECORDING MEDIUM

CROSS-REFERENCE TO RELATED PATENT APPLICATION

This U.S. non-provisional patent application is a divisional application of U.S. patent application Ser. No. 14/201,017, filed on Mar. 7, 2014, which claims priority under 35 U.S.C. §119 to Japanese Patent Application No. 2013-271927 filed on Dec. 27, 2013 in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device, and a non-transitory computer-readable recording medium.

2. Description of the Related Art

It has been known that a vacuum pump such as a turbo molecular pump (TMP) or the like is used in an exhaust system in order to perform an ultra-high vacuum process in a substrate processing apparatus of a semiconductor manufacturing apparatus or the like (see, for example, Patent Document 1 below).

PRIOR ART DOCUMENT

Patent Document

1. Japanese Patent Application Publication No. H11-300193

SUMMARY OF THE INVENTION

Generally, it cannot be said that a vacuum pump to achieve a high vacuum or an ultra-high vacuum such as a turbo molecular pump has high critical backing pressure, and an auxiliary pump for exhausting up to atmospheric pressure is provided on a downstream side of the vacuum pump. Thus, another component is generally connected to the downstream side of the vacuum pump, but the other components can be factors for causing a pressure variation on the downstream side of the vacuum pump. If the pressure on the downstream side of the vacuum pump rises due to some reasons, a gas flows back to the vacuum pump, and therefore there is a possibility that operations of the vacuum pump becomes unstable.

It is an object of the present invention to provide a substrate processing apparatus which prevents operations of a vacuum pump provided in an exhaust system from being unstable, a method of manufacturing a semiconductor device, and a non-transitory computer-readable recording medium.

According to one aspect of the present invention, there is provided a method of manufacturing a semiconductor device by processing a substrate by supplying a processing space with a gas dispersed in a buffer space disposed at an upstream side of the processing space, the method comprising: (a) transferring the substrate into the processing space while exhausting a transfer space of the substrate by a first vacuum pump; (b) closing a first valve disposed at a downstream side of the first vacuum pump; (c) supplying the gas into the processing space via the buffer space; and (d) exhausting the buffer space through an exhaust pipe connected to a downstream side of the first valve.

According to another aspect of the present invention, a method of manufacturing a semiconductor device by processing a substrate by supplying a gas into a processing container, the method comprising: (a) exhausting the processing container by a first vacuum pump disposed at one of a plurality of exhaust pipes connected to the processing container and a second vacuum pump disposed at a downstream side of the plurality of exhaust pipes; (b) supplying an inert gas, with a valve disposed at an upstream side of the first vacuum pump at the one of the plurality of exhaust pipes closed, into the first vacuum pump by an inert gas supply unit connected to a portion of the one of the plurality of exhaust pipes between the first vacuum pump and the valve; (c) supplying the gas into the processing container; and (d) exhausting the processing container by the second vacuum pump through the plurality of exhaust pipes other than the one of the plurality of exhaust pipes.

DETAILED DESCRIPTION OF THE PREFERRED EMBODIMENTS

Hereinafter, a first embodiment of the present invention will be described with reference to the accompanying drawings.

[Configuration of Apparatus]

Figure 1:
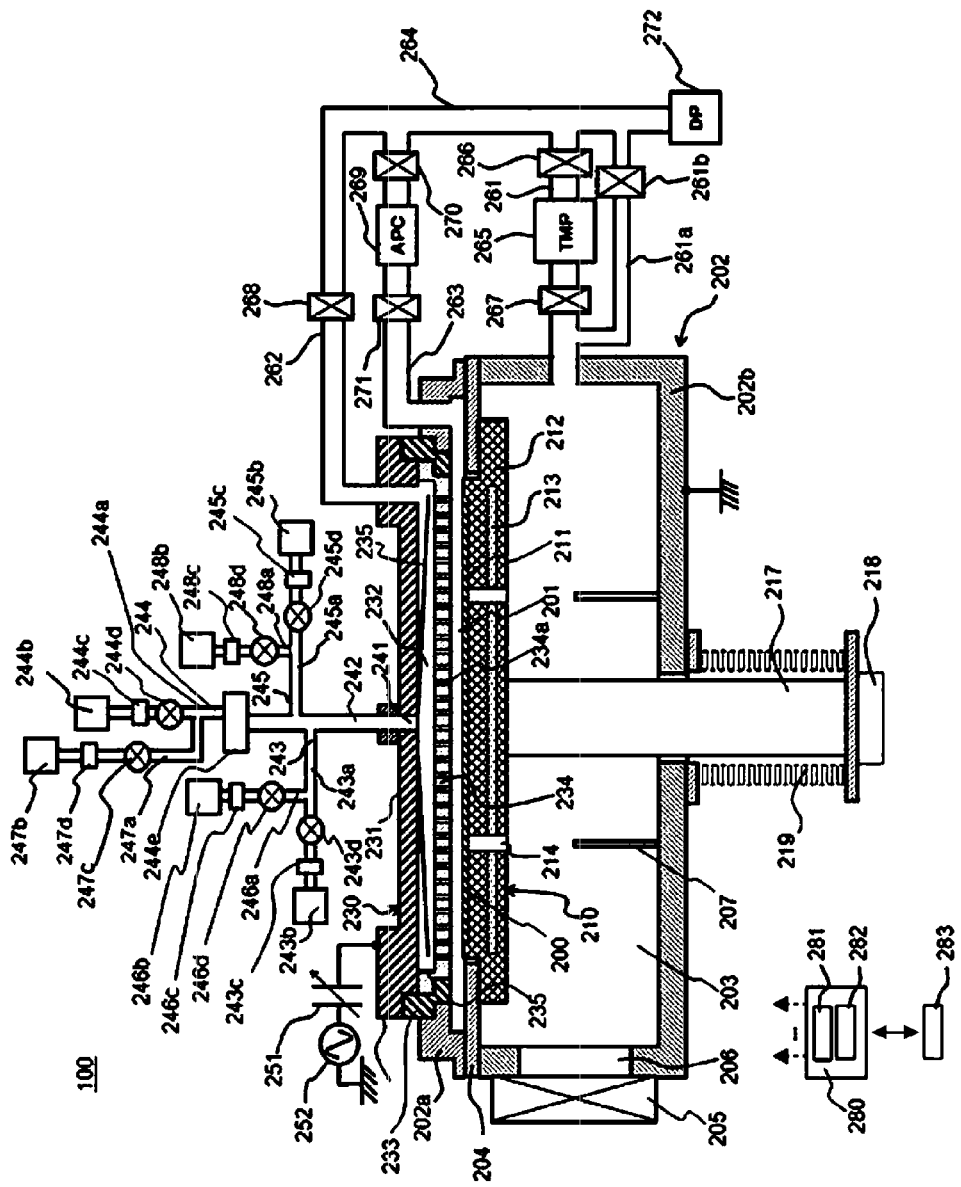
FIG. 1 is a diagram showing a substrate processing apparatus according to a first embodiment of the present invention.

A configuration of substrate processing apparatus 100 according to an embodiment of the present invention is shown in FIG. 1. The substrate processing apparatus 100 is configured as a batch-type substrate processing apparatus as shown in FIG. 1.

[Processing Container]

The substrate processing apparatus 100 includes a processing container 202 as shown in FIG. 1. The processing container 202 is configured as a flat sealed container whose cross-sectional surface has, for example, a circular shape. In addition, the processing container 202 is made of a metal material such as aluminum (Al), stainless steel (SUS), or the like. A processing space 201 that processes a wafer 200 such as a silicon wafer or the like as a substrate and a transfer space 203 through which the wafer 200 passes when the wafer 200 is transferred to the processing space 201 are formed in the processing container 202. The processing container 202 is constituted of an upper container 202a and a lower container 202b. A partition plate 204 is provided between the upper container 202a and the lower container 202b.

A substrate loading and unloading port 206 adjacent to a gate valve 205 is provided on a side surface of the lower container 202b, and the wafer 200 moves between the substrate loading and unloading port 206 and a transfer chamber, which is not shown, through the substrate loading and unloading port 206. A plurality of lift pins 207 are provided at a bottom of the lower container 202b. In addition, the lower container 202b is grounded.

A substrate support unit 210 that supports the wafer 200 is provided inside the processing space 201. The substrate support unit 210 mainly includes a placing surface 211 on which the wafer 200 is placed, a placing table 212 that has the placing surface 211 on a surface thereof, and a heater 213 as a heating source embedded in the substrate placing table 212. Through holes 214 through which the lift pins 207 pass are respectively provided at positions corresponding to the lift pins 207 on the substrate placing table 212.

The substrate placing table 212 is supported by a shaft 217. The shaft 217 penetrates the bottom of the processing container 202, and is also connected to an elevation mechanism 218 in the outside of the processing container 202. The shaft 217 and the substrate placing table 212 are elevated by operating the elevation mechanism 218, and therefore the wafer 200 that is mounted on the substrate placing surface 211 may be elevated. In addition, the vicinity of a lower end of the shaft 217 is coated with bellows 219, and the inside of the processing container 202 is kept in an airtight state.

The substrate placing table 212 descends to a position (wafer transfer position) in which the substrate placing surface 211 faces the substrate loading and unloading port 206 when transferring the wafer 200, and the wafer 200 ascends up to a processing position (wafer processing position) inside the processing space 201 as shown in FIG. 1 when processing the wafer 200.

Specifically, when the substrate placing table 212 descends to the wafer transfer position, an upper end of the lift pin 207 protrudes from an upper surface of the substrate placing surface 211, whereby the lift pin 207 may support the wafer 200 from a lower side. In addition, the lift pin 207 is buried from the upper surface of the substrate placing surface 211 when the substrate placing table 212 ascends up to the wafer processing position, whereby the substrate placing surface 211 supports the wafer 200 from the lower side. In addition, the lift pin 207 is brought into direct contact with the wafer 200, and therefore the lift pin 207 is preferably made of a material such as quartz, alumina, or the like.

A shower head 230 is provided as a gas dispersing mechanism in an upper portion (upstream side) of the processing space 201. A gas introduction port 241 is provided on a cover 231 of the shower head 230, and a supply system to be described later is connected to the gas introduction port 241. A gas being introduced from the gas introduction port 241 is supplied to a buffer space 232 of the shower head 230.

The cover 231 of the shower head is made of a conductive metal, and is used as an electrode for generating plasma within the buffer space 232 or the processing space 201. An insulation block 233 is provided between the cover 231 and the upper container 202a, and insulates between the cover 231 and the upper container 202a.

The shower head 230 includes a dispersion plate 234 for dispersing the gas supplied from the supply system through the gas introduction port 241. An upstream side of the dispersion plate 234 is the buffer space 232 and a downstream side thereof is the processing space 201. A plurality of through holes 234a are provided on the dispersion plate 234. The dispersion plate 234 is disposed to face the substrate placing surface 211.

A gas guide 235 that forms a flow of the supplied gas is installed in the buffer space 232. The gas guide 235 has a conical shape whose diameter increases toward the dispersion plate 234 with respect to the gas introduction port 241 as a vertex. A lower end of the gas guide 235 is positioned on further outward on a peripheral side than the through hole 234a formed on the outermost peripheral side of the dispersion plate 234.

[Supply System]

A common gas supply pipe 242 is connected to the gas introduction port 241 provided at the cover 231 of the shower head 230. A first gas supply pipe 243a, a second gas supply pipe 244a, and a third gas supply pipe 245a are connected to the common gas supply pipe 242. The second gas supply pipe 244a is connected to the common gas supply pipe 242 through a remote plasma unit 244e.

A first-element-containing gas is mainly supplied from a first gas supply system 243 including the first gas supply pipe 243a, and a second-element-containing gas is mainly supplied from a second gas supply system 244 including the second gas supply pipe 244a. An inert gas is mainly supplied from a third gas supply system 245 including the third gas supply pipe 245a when processing the wafer, and a cleaning gas is mainly supplied when cleaning the shower head 230 or the processing space 201.

[First Gas Supply System]

In the first gas supply pipe 243a, a first gas supply source 243b, a mass flow controller (MFC) 243c which is a flow rate controller (a flow rate control unit), and a valve 243d which is an opening/closing valve are provided sequentially from the upstream direction.

The gas containing a first element (hereinafter referred to as "first-element-containing gas") is supplied to the shower head 230 through the MFC 243c, the valve 243d, and the common gas supply pipe 242.

The first-element-containing gas is one of raw material gases, that is, processing gases. Here, the first element is, for example, silicon (Si). That is, the first-element-containing gas is, for example, a silicon-containing gas. For example, bis tertiary butyl amino silane ($SiH_2[NH(C_4H_9)]_2$, abbreviation: BTBAS) gas may be used as the silicon containing gas. In addition, the first-element-containing gas may be one of a solid, a liquid, and a gas at a normal temperature and a normal pressure. When the first-element-containing gas is liquid at the normal temperature and normal pressure, a vaporizer which is not shown may be provided between the first gas supply source 243b and the MFC 243c. Here, the first-element-containing gas will be described as a gas.

In addition, as the silicon-containing gas other than BTBAS, hexamethyl disilazane ($C_6H_{19}NSi_2$, abbreviation: HMDS) which is an organic silicon material, trysilylamine [$(SiH_3)_3N$, abbreviation: TSA], or the like may be used. These gases function as precursors.

A downstream end of a first inert gas supply pipe 246a is connected to the downstream side of a valve 243d of the first gas supply pipe 243a. In the first inert gas supply pipe 246a, an inert gas supply source 246b, a mass flow controller (MFC) 246c which is a flow rate controller (a flow rate control unit), and a valve 246d which is an opening/closing valve are provided sequentially from the upstream direction.

Here, the inert gas is, for example, nitrogen ($N_2$) gas. In addition, as inert gases other than nitrogen ($N_2$) gas, rare gases such as helium (He) gas, neon (Ne) gas, argon (Ar) gas, and the like may be used.

The first-element-containing gas supply system 243 (referred to as a silicon-containing gas supply system) is mainly constituted of the first gas supply pipe 243*a*, the mass flow controller 243*c*, and the valve 243*d*.

In addition, the first inert gas supply system is mainly constituted of the first inert gas supply pipe 246*a*, the mass flow controller 246*c*, and the valve 246*d*. In addition, the inert gas supply source 234*b* and the first gas supply pipe 243*a* may be included in the first inert gas supply system.

In addition, the first gas supply source 243*b* and the first inert gas supply system may be included in the first-element-containing gas supply system 243.

[Second Gas Supply System]

A remote plasma unit 244*e* is provided on the downstream in the second gas supply pipe 244*a*. A second gas supply source 244*b*, a mass flow controller (MFC) 244*c* which is a flow rate controller (a flow rate control unit), and a valve 244*d* which is an opening/closing valve are provided sequentially from the upstream direction.

The gas containing a second element (hereinafter referred to as a second-element-containing gas) is supplied into the shower head 230 from the second gas supply pipe 244*a* through the mass flow controller 244*c*, the valve 244*d*, the remote plasma unit 244*e*, and the common gas supply pipe 242. The second-element-containing gas is changed to a plasma state by the remote plasma unit 244*e* to be irradiated on the wafer 200.

The second-element-containing gas is one of the processing gases. In addition, the second-element-containing gas may be a reaction gas or a reformed gas.

Here, the second-element-containing gas contains the second element different from the first element. The second element is any one of oxygen (O), nitrogen (N), and carbon (C). In the embodiment of the present invention, an oxygen-containing gas will be used as the second-element-containing gas. Specifically, oxygen ($O_2$) gas is used as the oxygen-containing gas.

The second-element-containing gas supply system 244 (referred to as an oxygen-containing gas supply system) is mainly constituted of the second gas supply pipe 244*a*, the mass flow controller 244*c*, and the valve 244*d*.

In addition, a downstream end of a second inert gas supply pipe 247*a* is connected to the second gas supply pipe 244*a* downstream from the valve 244*d*. In the second inert gas supply pipe 247*a*, an inert gas supply source 247*b*, a mass flow controller 247*c* which is a flow rate controller (a flow rate control unit), and a valve 247*d* which is an opening/closing valve are provided sequentially from the upstream direction.

The inert gas is supplied into the shower head 230 from the second inert gas supply pipe 247*a* through the mass flow controller 247*c*, the valve 247*d*, the second gas supply pipe 243*a*, and the remote plasma unit 244*e*. The inert gas acts as a carrier gas or a dilution gas in a thin film forming process S104.

The second inert gas supply system is mainly constituted of the second inert gas supply pipe 247*a*, the mass flow controller 247*c*, and the valve 247*d*. In addition, the inert gas supply source 247*b*, the second gas supply pipe 244*a*, and the remote plasma unit 244*e* may be included in the second inert gas supply system.

In addition, the second gas supply source 244*b*, the remote plasma unit 244*e*, and the inert gas supply system may be included in the second-element-containing gas supply system 244.

[Third Gas Supply System]

In the third gas supply pipe 245*a*, a third gas supply source 245*b*, a mass flow controller 245*c* which is a flow rate controller (a flow rate control unit), and a valve 245*d* which is an opening/losing valve are provided sequentially from an upstream direction.

The inert gas as a purge gas is supplied into the shower head 230 from the third gas supply pipe 245*a* through the mass flow controller 245*c*, the valve 245*d*, and the common gas supply pipe 242.

Here, the inert gas is, for example, nitrogen ($N_2$) gas. In addition, as inert gases other than the $N_2$ gas, rare gases such as helium (He) gas, neon (Ne) gas, argon (Ar) gas, and the like may be used.

A downstream end of a cleaning gas supply pipe 248*a* is connected to the third gas supply pipe 245*a* downstream from the valve 245*d*. In the cleaning gas supply pipe 248*a*, a cleaning gas supply source 248*b*, a mass flow controller 248*c* which is a flow rate controller (a flow rate control unit), and a valve 248*d* which is an opening/closing valve are provided sequentially from the upstream direction.

The third gas supply system 245 is mainly constituted of the third gas supply pipe 245*a*, the mass flow controller 245*c*, and the valve 245*d*.

In addition, the cleaning gas supply system is mainly constituted of the cleaning gas supply source 248*a*, the mass flow controller 248*c*, and the valve 248*d*. In addition, the cleaning gas supply source 248*b* and the third gas supply pipe 245*a* may be included in the cleaning gas supply system.

In addition, the third gas supply source 245*b* and the cleaning gas supply system may be included in the third gas supply system 245.

In addition, in the substrate processing process, the inert gas is supplied into the shower head 230 from the third gas supply pipe 245*a* through the mass flow controller 245*c*, the valve 245*d*, and the common gas supply pipe 242. In addition, in the cleaning process, the cleaning gas is supplied into the shower head 230 through the mass flow controller 248*c*, the valve 248*d*, and the common gas supply pipe 242.

The inert gas supplied from the inert gas supply source 245*b* acts as a purge gas that purges remaining gases inside the processing container 202 or the shower head 230 in the substrate processing process. In addition, in the cleaning process, the inert gas may act as a carrier gas or a dilution gas of the cleaning gas.

In the cleaning process, the cleaning gas supplied from the cleaning gas supply source 248*b* acts as a cleaning gas that removes byproducts or the like attached to the shower head 230 or the processing container 202.

Here, the cleaning gas is, for example, nitrogen trifluoride ($NF_3$) gas. In addition, as the cleaning gas, hydrogen fluoride (HF) gas, chlorine fluoride ($ClF_3$) gas, fluorine ($F_2$) gas, and the like may be used or a combination thereof may also be used.

[Plasma Generation Unit]

A matcher 251 and a high-frequency power source 252 are connected to the cover 231 of the shower head. Plasma is generated in the shower head 230 and the processing space 201 by adjusting impedance using the high-frequency power source 252 and the matcher 251.

[Exhaust System]

An exhaust system that exhausts an atmosphere of the processing container 202 includes a plurality of exhaust pipes connected to the processing container 202. Specifically, an exhaust pipe 261 (first exhaust pipe) connected to the transfer space 203, an exhaust pipe 262 (second exhaust pipe) connected to the buffer space 232, and a third exhaust pipe 263 (third exhaust pipe) connected to the processing space 201 are included in the exhaust system. In addition, an exhaust pipe 264 (fourth exhaust pipe) is connected to the downstream side of the respective exhaust pipes 261, 262, and 263.

The first exhaust pipe 261 is connected to a side surface or a bottom surface of the transfer space 203. A turbo molecular pump (TMP) 265 (first vacuum pump) is provided as a vacuum pump that creates high vacuum or ultra-high vacuum in the first exhaust pipe 261. A valve 266 is provided on a downstream side of the TMP 265 in the first exhaust pipe 261. In addition, a valve 267 is provided on an upstream side of the TMP 265 in the first exhaust pipe 261. In addition, a bypass pipe 261a is connected to an upstream side of the valve 267 in the first exhaust pipe 261. A valve 261b is provided in the bypass pipe 261a. A downstream side of the bypass pipe 261a is connected to the fourth exhaust pipe 264.

The second exhaust pipe 262 is connected to an upper surface or a side surface of the buffer space 232. A valve 268 is connected to the second exhaust pipe 262.

The third exhaust pipe 263 is connected to a side of the processing space 201. An auto pressure controller (APC) 269 which is a pressure controller that controls the inside of the processing space 201 in a predetermined pressure is provided in the third exhaust pipe 263. The APC 269 includes a valve disk (not shown) which can adjust an opening degree, and adjusts conductance of the third exhaust pipe 263 in accordance with an instruction from a controller which will be described later. A valve 270 is provided downstream from the APC 269 in the third exhaust pipe 263. In addition, a valve 271 is provided upstream from the APC 269 in the third exhaust pipe 263.

A dry pump (DP) 272 is provided in the fourth exhaust pipe 264. As shown in FIG. 1, the second exhaust pipe 262, the third exhaust pipe 263, the first exhaust pipe 261, and a bypass pipe 261a are connected to the fourth exhaust pipe 264 sequentially from the upstream side of the fourth exhaust pipe 264, and the DP 272 is provided downstream from these. The DP 272 exhausts each atmosphere of the buffer space 232, the processing space 201, and the transfer space 203 through each of the second exhaust pipe 262, the third exhaust pipe 263, the first exhaust pipe 261, and the bypass pipe 261a. In addition, when the TMP 265 is operated, the DP 272 acts as an auxiliary pump. That is, it is difficult for the TMP 265 which is a high vacuum (an ultra-high vacuum) pump to exhaust up to atmospheric pressure, and therefore the DP 272 is used as an auxiliary pump that exhausts up to atmospheric pressure. An air valve is used in each valve of the exhaust system described above.

[Controller]

The substrate processing apparatus 100 includes a controller 280 that controls operations of each unit of the substrate processing apparatus 100. The controller 280 includes at least a computation unit 281 and a memory unit 282. The controller 280 is connected to each configuration described above, calls a program or a recipe from the memory unit 282 in accordance with the instruction of the controller or a user, and controls operations of each configuration in accordance with the contents of the instruction.

In addition, the controller may be configured as a dedicated computer or a universal computer. The controller 280 according to an embodiment of the present invention may be configured such that an external memory device 283 (for example, a magnetic tape, a magnetic disk such as a flexible disk or a hard disk, an optical disc such as CD or DVD, a magneto optical disc such as MO, a semiconductor memory such as a USB memory (USB flash drive) or a memory card) storing the above-described program is prepared and the program is installed in the universal computer using the external memory device 283.

In addition, a means for supplying the program to the computer is not limited to a case in which the program is supplied to the computer through the external memory device 283. For example, the program may be supplied using a communication means such as the Internet, a dedicated line, or the like not through the external memory device 283. In addition, the memory unit 282 or the external memory device 283 is configured as a computer-readable recording medium. Hereinafter, these will be collectively referred to as a recording medium. In addition, the case in which the term of the recording medium is used in the present invention includes a case of including only the memory unit 282, a case of including only the external memory device 283, or a case of including both.

[Substrate Processing Process]

Next, a process of forming a thin film on the wafer 200 using the substrate processing apparatus 100 will be described. In addition, operations of each unit constituting the substrate processing apparatus 100 are controlled by the controller 280.

Figure 2:
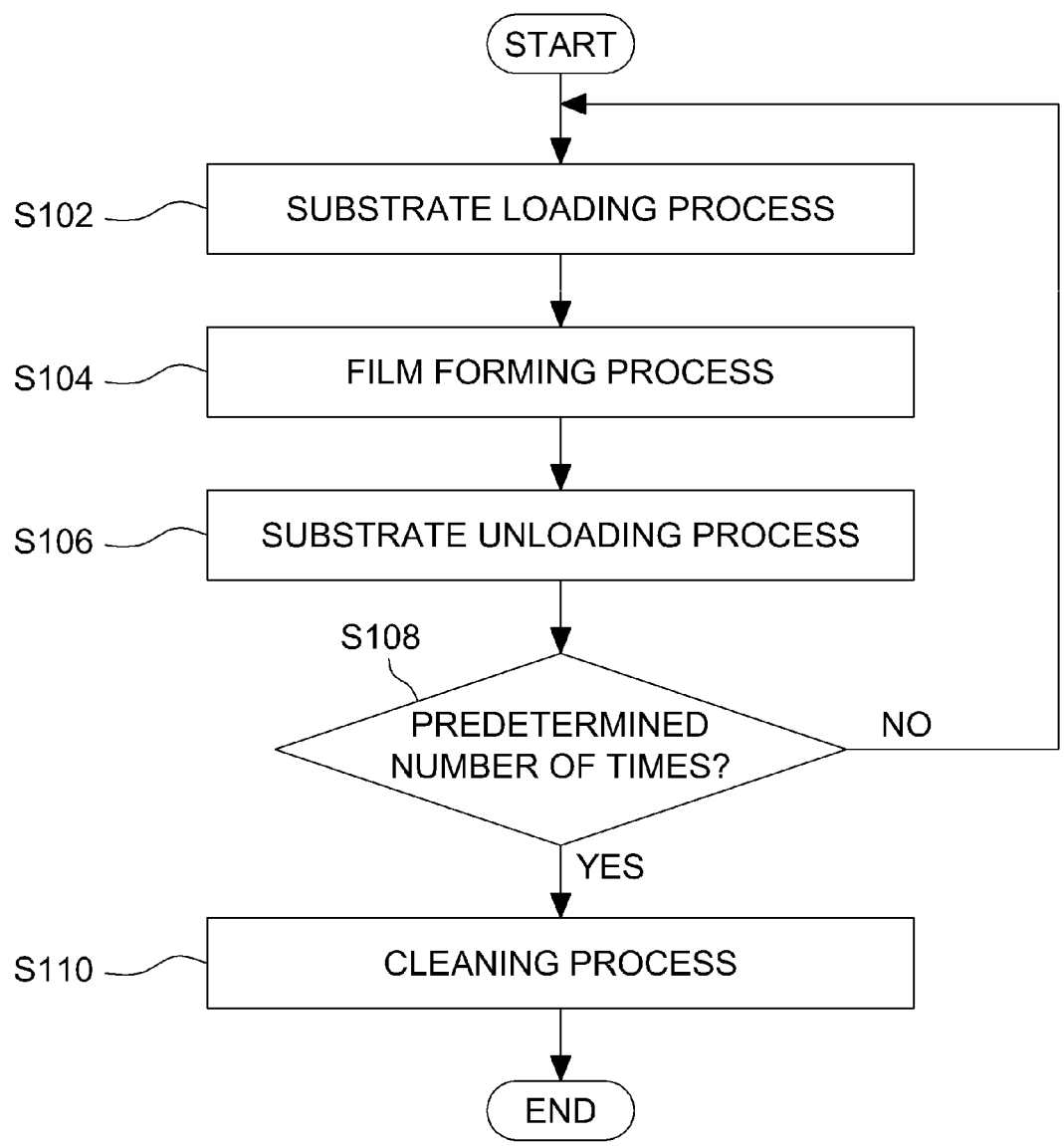
FIG. 2 is a flowchart showing a substrate processing process of the substrate processing apparatus shown in FIG. 1.
Figure 3:
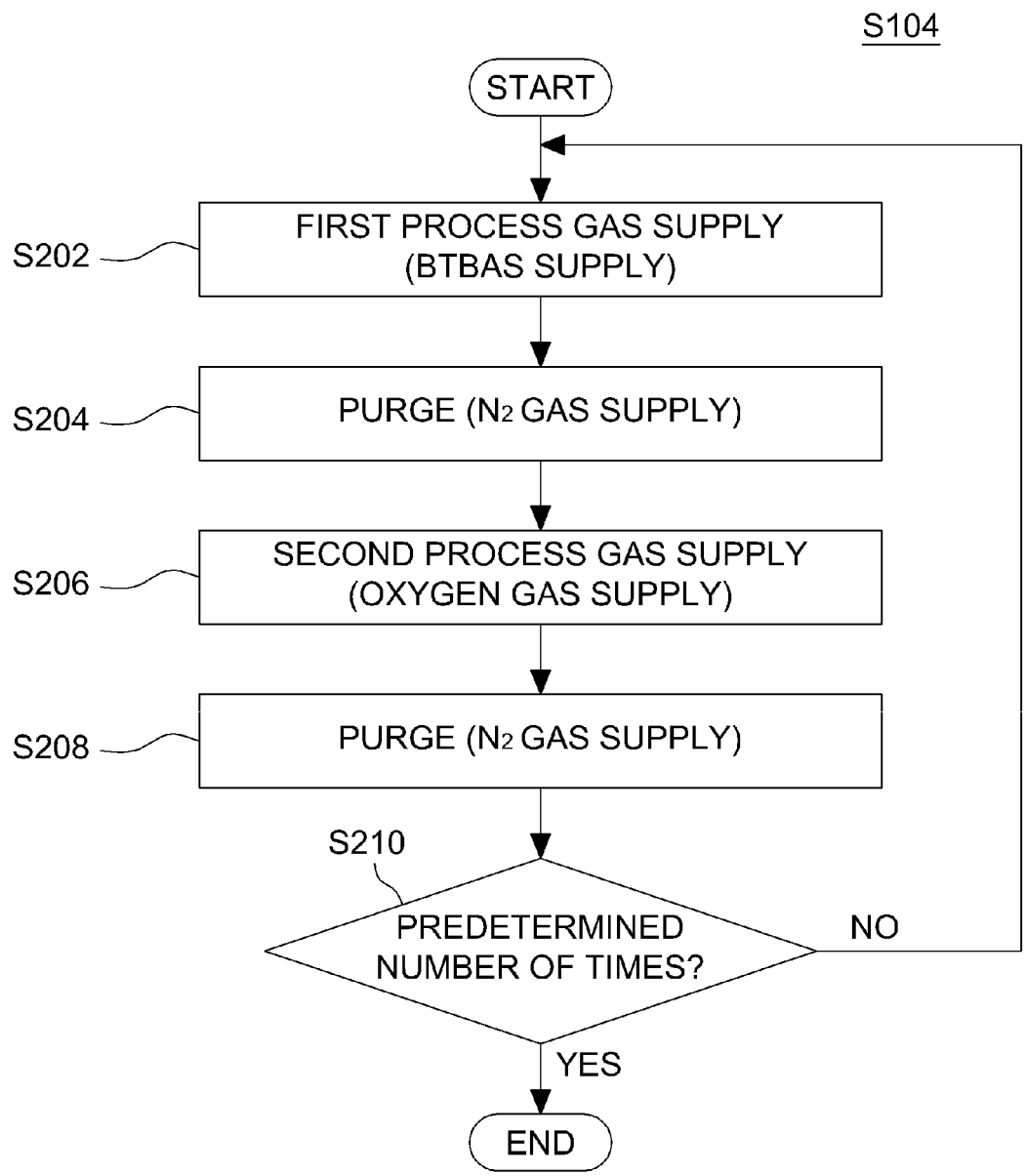
FIG. 3 is a flowchart showing a film forming process shown in FIG. 2, in detail.
Figure 4:
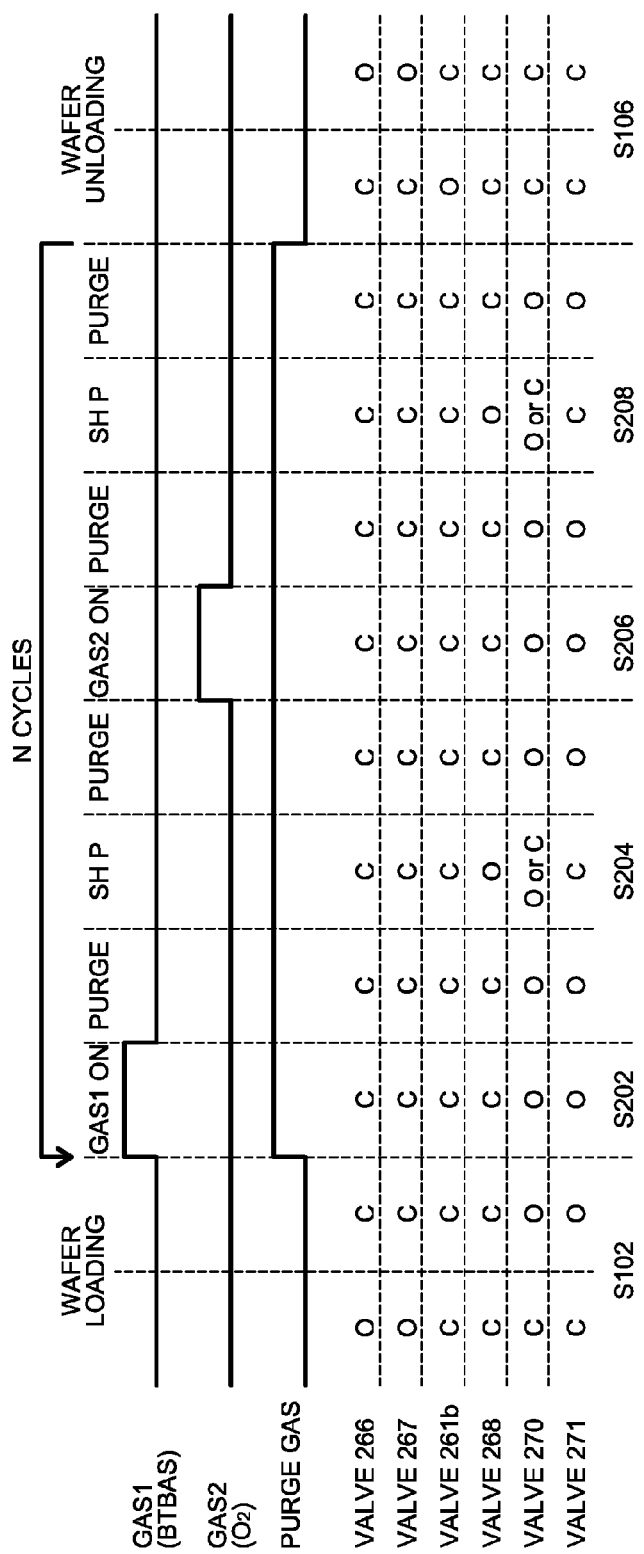
FIG. 4 is a sequence diagram showing an operation of an exhaust system of the substrate processing apparatus shown in FIG. 1.

FIG. 2 is a flowchart showing a substrate processing process according to an embodiment of the present invention. FIG. 3 is a flowchart showing the film forming process of FIG. 2 in detail. In addition, FIG. 4 is a sequence diagram showing opening and closing of valves of the exhaust system in each process. In FIG. 4, "O" indicates opening of the valve, and "C" indicates closing of the valve.

Hereinafter, an example in which a silicon oxide film is formed on the wafer 200 as a thin film using the BTBAS gas as the first processing gas and the oxygen ($O_2$) gas as the second processing gas will be described.

[Substrate Loading/Placing Process (S102)]

In the substrate processing apparatus 100, the lift pin 207 penetrates the through hole 214 of the substrate placing table 212 by lowering the substrate placing table 212 to a transfer position of the wafer 200. As a result, the lift pin 207 protrudes only by a predetermined height from a surface of the substrate placing table 212. Subsequently, the transfer space 203 is brought in communication with a transfer chamber (not shown) by opening the gate valve 205. Next, the wafer 200 is carried into the transfer space 203 from the transfer chamber using a wafer transfer machine (not shown), and transferred on the lift pin 207. Thus, the wafer 200 is supported in a horizontal posture on the lift pin 207 protruding from the surface of the substrate placing table 212.

When the wafer 200 is carried into the processing container 202, the wafer transfer machine is retracted to the outside of the processing container 202, and the gate valve 205 is closed to seal the inside of the processing container 202. Next, the wafer 200 is mounted on the substrate placing surface 211 provided in the substrate placing table 212 by elevating the substrate placing table 212, and the wafer 200 is elevated up to the processing position inside the above-described processing space 201 by elevating the substrate placing table 212.

Operations of respective valves of the exhaust system in the substrate loading/placing process S102 will be described with reference to FIG. 4. First, when carrying the wafer 200 into the processing container 202, the valve 266 and the valve 267 are opened, and the TMP 265 and the DP 272 are brought in communication with each other while bringing the transfer space 203 and the TMP 265 in communication with each other. Meanwhile, valves of the exhaust system other than the valve 266 and the valve 267 are closed. Thus, atmosphere of the transfer space 203 is exhausted by the TMP 265 (and DP 272), and the processing container 202 reaches a high vacuum state (ultra-high vacuum) state (for example, $10^{-5}$ Pa or less). The processing container 202 enters the high vacuum (ultra-high vacuum) state to reduce a pressure difference with the transfer chamber which is kept in the high vacuum (ultra-high vacuum) state (for example, $10^{-6}$ Pa or less) in the same manner. In this state, the gate valve 205 is opened, and the wafer 200 is carried into the transfer space 203 from the transfer chamber. In addition, the TMP 265 and the DP 272 are always operated in the process shown in FIGS. 2 and 3 to prevent occurrence of delay of the processing process due to elevating operations of the TMP 265 and the DP 272.

When the wafer 200 is carried into the transfer space 203 and then elevated up to the processing position inside the processing space 201, the valve 266 and the valve 267 are closed. Thus, blocking is performed between the transfer space 203 and the TMP 265 and between the TMP 265 and the exhaust pipe 264, and exhaust of the transfer space 203 by the TMP 265 is completed. Meanwhile, the valve 270 and the valve 271 are opened, and the APC 269 and the DP 272 are brought in communication with each other while bringing the processing space 201 and the APC 269 in communication with each other. The APC 269 controls an exhaust flow rate of the processing space 201 by the DP 272 by adjusting a conductance of the exhaust pipe 263, whereby the processing space 201 is kept at a predetermined pressure (for example, high vacuum of $10^{-5}$ Pa to $10^{-1}$ Pa). In addition, another valve of the exhaust system is kept open. In addition, when closing the valve 266 and the valve 267, the valve 267 positioned on the upstream side of the TMP 265 is closed, and then the valve 266 is closed, whereby the operation of the TMP 265 remains stable.

In addition, in this process, $N_2$ gas may be supplied into the processing container 202 as the inert gas from the inert gas supply system while exhausting the inside of the processing container 202. That is, by opening a valve 245d of at least the third gas supply system while exhausting the inside of the processing container 202 by the TMP 265 or the DP 272, the $N_2$ gas may be supplied into the processing container 202.

In addition, when placing the wafer 200 on the substrate placing table 212, power is supplied to a heater 213 embedded inside the substrate placing table 212, whereby the surface of the wafer 200 is controlled to have a predetermined temperature. The temperature of the wafer 200 is room temperature or higher and 500° C. or lower, and preferably, room temperature or higher and 400° C. or lower. In this instance, the temperature of the heater 213 is adjusted by controlling the energizing state to the heater 213 based on temperature information detected by a temperature sensor which is not shown.

[Film Forming Process (S104)]

Next, a film forming process S104 is performed. Hereinafter, the thin film forming process S104 will be described in detail with reference to FIG. 3. In addition, the film forming process S104 is a cyclic process in which a process of alternately supplying another processing gas is repeated.

[First Processing Gas Supply Process (S202)]

When a desired temperature is obtained by heating the wafer 200, a mass flow controller 243c is adjusted so that a flow rate of BTBAS gas becomes a predetermined flow rate, while opening a valve 243d. In addition, the supply flow rate of the BTBAS is, for example, 100 sccm or more and 5.000 sccm or less. In this instance, the valve 245d of the third gas supply system is opened, and the $N_2$ gas is supplied from the third gas supply pipe 245a. In addition, the $N_2$ gas may flow from the first inert gas supply system. In addition, prior to this process, supply of the $N_2$ gas from the third gas supply pipe 245a may start.

The BTBAS gas supplied to the processing container 202 may be supplied onto the wafer 200. The BTBAS gas is brought into contact with the surface of the wafer 200, and therefore a silicon-containing layer is formed as "a first-element-containing layer" on the surface of the wafer 200.

The silicon-containing layer is formed with a predetermined thickness and in a predetermined distribution in accordance with the pressure inside the processing container 202, the flow rate of the BTBAS gas, a temperature of a shaft 217, a time required for passing through the processing space 201, and the like. In addition, a predetermined film may be formed in advance on the wafer 200. In addition, a predetermined pattern may be formed in advance on the wafer 200 or the predetermined film.

After a predetermined time has passed from the start of supply of the BTBAS gas, the valve 243d is closed, and the supply of the BTBAS gas is stopped. In the above-described process S202, the valve 270 and the valve 271 are opened as shown in FIG. 4, and the pressure inside the processing space 201 is controlled to be a predetermined pressure by the APC 269. In the process S202, valves of the exhaust system other than the valve 270 and the valve 271 are all closed.

[Purge Process (S204)]

Subsequently, the shower head 230 and the processing space 201 are purged by supplying the $N_2$ gas from the third gas supply pipe 245a. Also at this time, the valve 270 and the valve 271 are opened, and the pressure inside the processing space 201 is controlled to be a predetermined pressure by the APC 269. Meanwhile, the valves of the exhaust system other than the valve 270 and the valve 271 are all closed. Thus, the BTBAS gas not adhered to the wafer 200 in the first processing gas supply process S202 is removed from the processing space 201 through the exhaust pipe 263 by the DP 272.

Subsequently, the shower head 230 is purged by supplying the $N_2$ gas from the third gas supply pipe 245a. In this instance, among the valves of the exhaust system, the valve 270 and the valve 271 are closed as shown by "SHP" of FIG. 4, whereas the valve 268 is opened. The other valves of the exhaust system are kept in a closed state. That is, when the shower head 230 is purged, blocking between the APC 269 and the exhaust pipe 264 is performed while blocking between the processing space 201 and the APC 269 is performed, whereby the buffer space 232 and the DP 272 are brought in communication with each other while the pressure control by the APC 269 is stopped. Thus, the BTBAS gas remaining inside the shower head 230 (buffer space 232) is exhausted from the shower head 230 through the exhaust pipe 262 by the DP 272. In this instance, the valve 270 on the downstream side of the APC 269 may be opened.

When the purging of the shower head 230 is completed, the valve 268 is closed to perform blocking between the shower head 230 and the exhaust pipe 264 while the valve 270 and the valve 271 are opened to start the pressure control by the APC 269. The other valves of the exhaust system are kept in a closed state. Also at this time, the supply of the N₂ gas from the third gas supply pipe 245a continues, and the shower head 230 and the processing space 201 continue to be purged. In addition, in the purge process S204, purging through the exhaust pipe 263 is performed before and after the purging through the exhaust pipe 262 is performed, but only the purging through the exhaust pipe 262 may be performed. In addition, the purging through the exhaust pipe 262 and the purging through the exhaust pipe 263 may be simultaneously performed.

[Second Processing Gas Supply Process (S206)]

After the purge process S204, the valve 244d is opened, and supply of oxygen gas into the processing space 201 through the shower head 230 is started.

In this instance, the mass flow controller 244c is adjusted so that a flow rate of the oxygen gas becomes a predetermined flow rate. In addition, the flow rate of the oxygen gas to be supplied is, for example, 100 sccm or more and 5,000 sccm or less. In addition, the N₂ gas serving as a carrier gas may flow from the second inert gas supply system together with the oxygen gas. In addition, also in this process, the valve 245d of the third gas supply system is opened, and the N₂ gas is supplied from the third gas supply pipe 245a.

The oxygen gas in a plasma state is supplied onto the wafer 200. The silicon containing-layer which has already been formed is reformed by the plasma of the oxygen gas, and therefore a layer containing, for example, a silicon element and an oxygen element is formed on the wafer 200.

The reformed layer is formed with a predetermined thickness, in a predetermined distribution, and in an intrusion depth of a predetermined oxygen element or the like into the silicon-containing layer in accordance with the pressure inside the processing container 203, the flow rate of the oxygen gas, a temperature of the substrate placing table 212, a power supply state of a plasma generation unit, and the like.

After a predetermined time has passed, the valve 244d is closed, and the supply of the oxygen gas is stopped.

Also in the process S206, in the same manner as the above-described process S202, the valve 270 and the valve 271 are opened, and the pressure inside the processing space 201 is controlled to be a predetermined pressure by the APC 269. In addition, the valves of the exhaust system other than the valve 270 and the valve 271 are all closed.

[Purge Process (S208)]

Subsequently, a purge process is performed in the same manner as in the process S204. Operations of the respective components have been described in the process S204, and thus description thereof will be omitted.

[Determination (S210)]

The controller 280 determines whether the above-described one cycle is performed a predetermined number of times (n cycles).

When the one cycle is not performed the predetermined number of times (No in S210), the cycle including the first processing gas supply process S202, the purge process S204, the second processing gas supply process S206, and the purge process S208 is repeatedly performed. When the one cycle is performed the predetermined number of times (Yes in S210), the process shown in FIG. 3 is terminated.

Returning to the description of FIG. 2, the substrate unloading process S106 is performed.

[Substrate Unloading Process (S106)]

In the substrate unloading process S106, the wafer 200 is supported on the lift pin 207 which protrudes from the surface of the substrate placing table 212 by lowering the substrate placing table 212. Thus, the location of the wafer 200 is changed to a transfer position from the processing position. Next, the wafer 200 is carried out of the processing container 202 using the wafer transfer machine. In this instance, the valve 245d is closed to stop supply of the inert gas into the processing container 202 from the third gas supply system.

Operations of the respective valves of the exhaust system in the substrate unloading process S106 are the same as shown in FIG. 4. First, the valve 270 and the valve 271 are closed while the wafer 200 moves from the processing position to the transfer position, thereby stopping the pressure control by the APC 269. Meanwhile, a valve 261b is opened so that the transfer space 203 and the DP 272 communicate with each other, and the transfer space 203 is exhausted by the DP 272. In this instance, valves of the exhaust system other than the valve 261b are kept in a closed state.

Subsequently, when the wafer 200 moves to the transfer position, the valve 261b is closed to perform blocking between the transfer space 203 and the exhaust pipe 264.

Meanwhile, the valve 266 and the valve 267 are opened to exhaust the atmosphere of the transfer space 203 by the TMP 265 (and the DP 272), whereby the processing container 202 is kept in a high vacuum (ultra-high vacuum) state (for example, $10^{-5}$ Pa or less), and a pressure difference with the transfer chamber which is kept in a high vacuum (ultra-high vacuum) state (for example, $10^{-6}$ Pa or less) in the same manner is reduced. In this state, by opening the gate valve 205, the wafer 200 is carried out of the processing container 202 to the transfer chamber.

[Processing Frequency Determination Process (S108)]

After the wafer 200 is carried out, whether the film forming process reaches a predetermined number of times is determined. When it is determined that the film forming process reaches the predetermined number of times, the corresponding process proceeds to a cleaning process. When it is determined that the film forming process does not reach the predetermined number of times, the corresponding process proceeds to the substrate loading/placing process S102 in order to start processing of the next standby wafer 200.

[Cleaning Process (S110)]

When it is determined that the film forming process reaches the predetermined number of times in the processing frequency determination process S108, the cleaning process is performed. Here, a valve 248d of a cleaning gas supply system is opened, and a cleaning gas is supplied into the processing space 201 through the shower head 230.

When the cleaning gas satisfies the shower head 230 and the processing space 201, an impedance is adjusted by a matcher 251 while applying electric power to a high-frequency power source 252, thereby generating plasma of the cleaning gas in the processing space 201. The generated cleaning gas plasma removes byproducts attached to the shower head 230 and an inner wall of the processing space 201.

As described above, the plurality of exhaust systems, that is, the exhaust pipes 263, 261, and 262, are respectively connected to the processing space 201, the transfer space 203, and the buffer space 232 in the processing container 202. In addition, the TMP 265 is provided in the exhaust pipe 261 connected to the transfer space 203. The exhaust pipe 264 is connected to a downstream side of each of the exhaust pipes 263, 261, and 262, and the DP 272 is provided in the exhaust pipe 264. In a case in which the DP 272 is commonly used in each of the exhaust systems in this manner, when exhaust is performed by the DP 272 from the exhaust system other than the exhaust pipe 261 in which the TMP 265 is provided, pressure (pressure of the exhaust pipe 264) on the downstream side of the TMP 265 rises, and a gas flows back to the vacuum pump, whereby there is a possibility of operations of the TMP 265 becoming unstable. When the gas flows back to the TMP 265, the TMP 265 is likely to be broken and damaged in some cases. Particularly in the cyclic process of alternately and repeatedly supplying other processing gases, a relatively large pressure variation on the exhaust system is repeated multiple times in a short time, and therefore pressure management on the downstream side of the TMP 265 is important in order to keep the operation of the TMP 265 stable.

Therefore, in the present embodiment, the valve 266 is provided downstream from the TMP 265 in the exhaust pipe 261 in which the TMP 265 is provided, and when exhaust is performed by the DP 272 through other exhaust pipes 262 and 263, the valve 266 is closed and blocking between the TMP 265 and the exhaust pipe 264 downstream from the TMP 265 is performed. Specifically, when the valve 268 provided in the exhaust pipe 262 is opened, that is, when the shower head 230 (buffer space 232) is purged, the valve 266 downstream from the TMP 265 is always closed, thereby performing blocking between the TMP 265 and the exhaust pipe 264. In addition, when the valves 270 and 271 provided in the exhaust pipe 263 are opened, that is, when pressure inside the processing space 201 is adjusted by the APC 269, or when the processing space 201 is purged, the valve 266 is always closed, thereby performing blocking between the TMP 265 and the exhaust pipe 264. Thus, the gas flowing in the exhaust pipe 264 does not flow back to the TMP 265, thereby preventing the operation of the TMP 265 from becoming unstable. In particular, even when the pressure variation on the exhaust system frequently occurs in the cyclic process of alternately and repeatedly supplying other processing gases, the operation of the TMP 265 does not become unstable, thereby reducing the probability of occurrence of breakage or the like of the TMP 265. In addition, when the valve 266 and the valve 267 in front of and behind the TMP 265 are closed, the valve 267 positioned upstream from the TMP 265 is closed and then the valve 266 is closed, whereby the operation of the TMP 265 can be kept stable to further reduce the probability of occurrence of breakage or the like of the TMP 265.

Next, a second embodiment of the present invention will be described.

[Apparatus Configuration]

Figure 5:
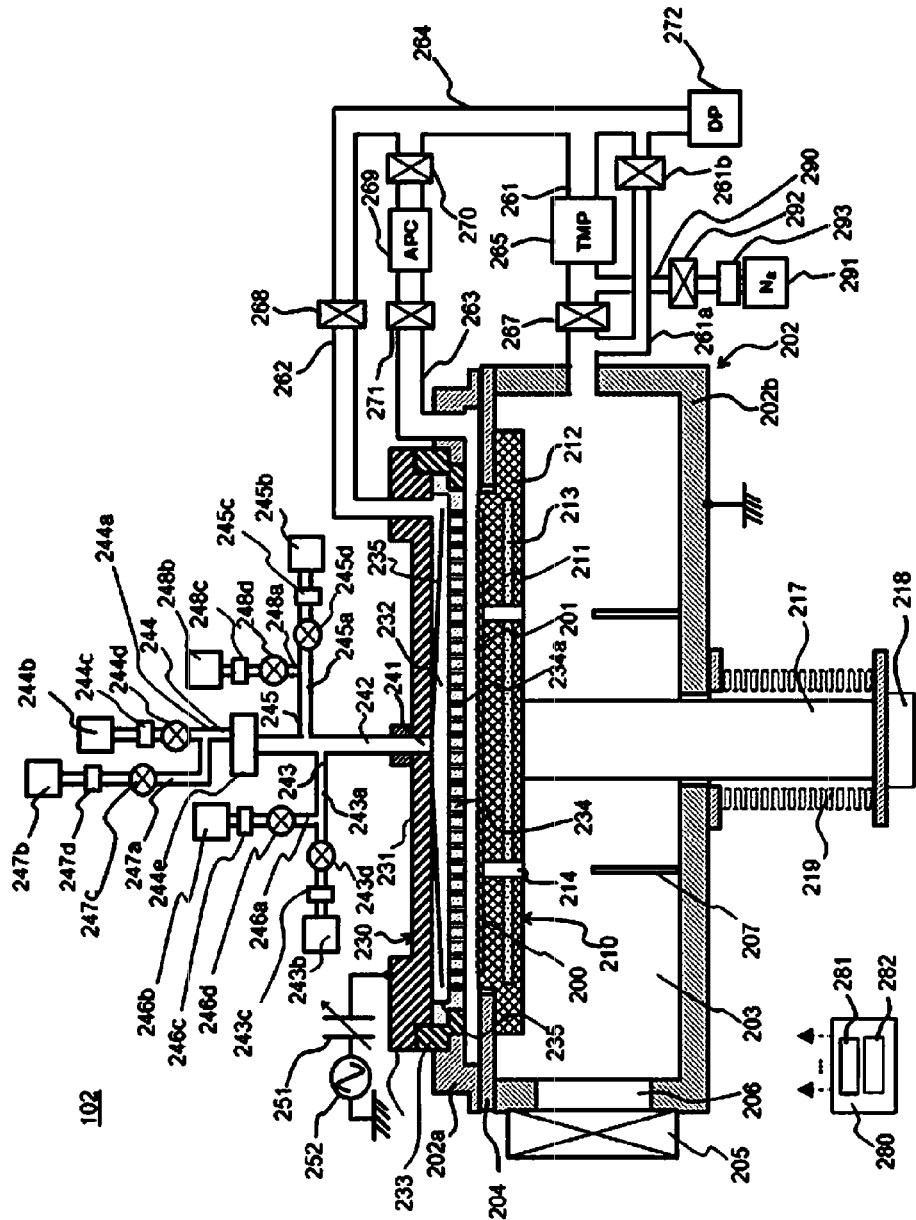
FIG. 5 is a diagram showing a substrate processing apparatus according to a second embodiment of the present invention.

A substrate processing apparatus 102 according to the second embodiment is shown in FIG. 5. In addition, the same reference numerals are used to designate the same configurations as in the substrate processing apparatus 100 according to the first embodiment, and thus description thereof will be omitted.

In the substrate processing apparatus 102 according to the second embodiment, an inert gas supply unit that supplies $N_2$ gas between the TMP 265 and the valve 267 upstream from the TMP 265 in the exhaust pipe 261 is provided. The inert gas supply unit includes a supply pipe 290, an inert gas supply source 291 connected to the downstream side of the supply pipe 290, a valve 292 provided upstream from the inert gas supply source 291 in the supply pipe 290, and a mass flow controller (MFC) 293 which is provided between the inert gas supply source 291 and the valve 292 in the supply pipe 290. The operation of the valve 292 or the mass flow controller 293 is controlled by a controller 280. In addition, in the substrate processing apparatus 102 according to the second embodiment, a valve downstream from the TMP 265 is not provided in the exhaust pipe 261 connected to the transfer space 203. In addition, the above-described various rare gases other than the $N_2$ gas may be used as the inert gas supplied from the inert gas supply unit.

<Substrate Processing Process>

Next, a process of forming a thin film on the wafer 200 using a substrate processing apparatus 102 will be described. The difference between the first and second embodiments is in the operation of the exhaust system, and a basic flow of the substrate processing process is the same as the flowchart shown in FIGS. 2 and 3. Thus, only the operation of the exhaust system will be described.

Figure 6:
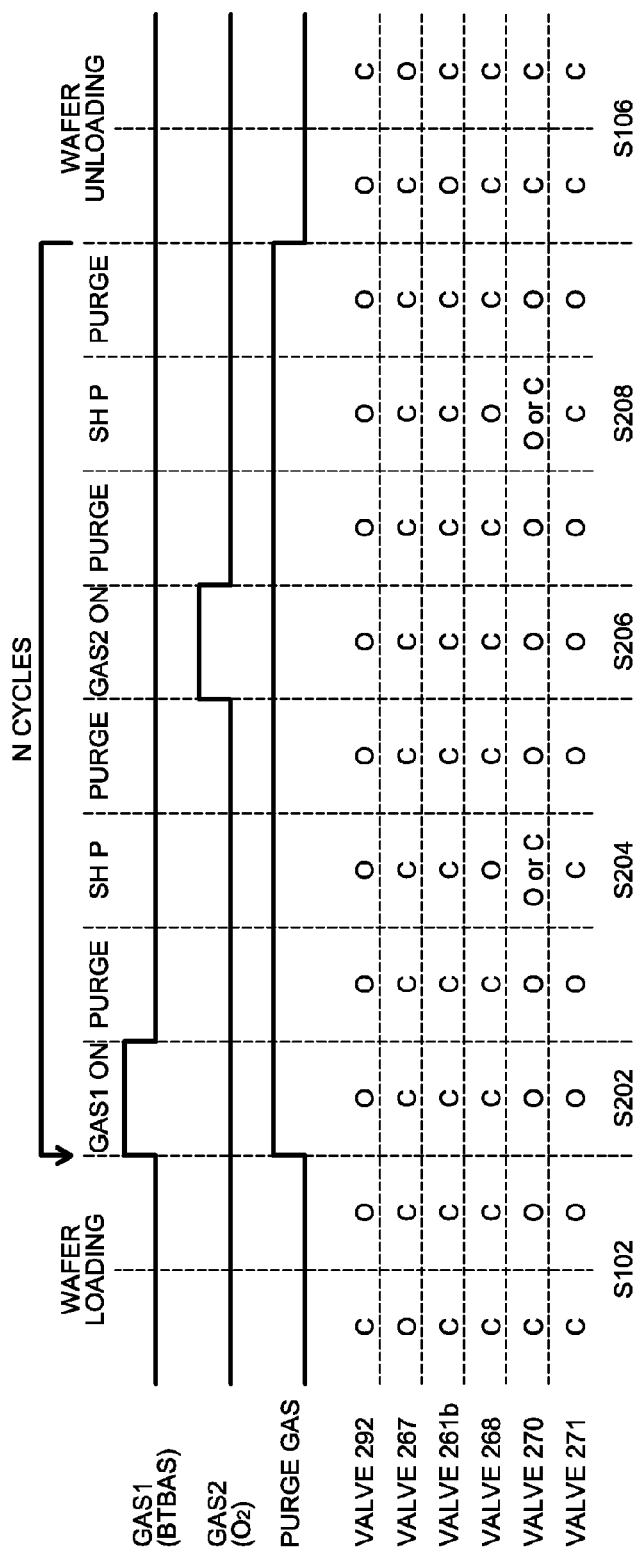
FIG. 6 is a sequence diagram showing an operation of an exhaust system of the substrate processing apparatus shown in FIG. 5.

FIG. 6 is a sequence diagram showing opening and closing of the valve of the exhaust system in the film forming process according to the second embodiment. As shown in FIG. 6, when the wafer 200 is carried into the processing container 202 in S102 (substrate loading process), the valve 267 is opened, whereby the transfer space 203 and the TMP 265 are brought in communication with each other. Thus, the atmosphere of the transfer space 203 is exhausted by the TMP 265 (and DR 272), and the processing container 202 reaches a high vacuum (ultra-high vacuum) state (for example, $10^{-5}$ Pa or less). In this instance, the valves of the exhaust system other than the valve 267 are closed.

When the wafer 200 is carried into the transfer space 203 and then elevated up to the processing position inside the processing space 201, the valve 267 is closed. Thus, blocking between the transfer space 203 and the TMP 265 is performed, and exhaust of the transfer space 203 by the TMP 265 is completed. Meanwhile, the valve 270 and the valve 271 are opened, and the processing space 201 is kept at a predetermined pressure (for example, high vacuum of $10^{-5}$ Pa to $10^{-1}$ Pa) by the APC 269. In addition, by opening the valve 292 of the supply pipe 290, $N_2$ gas is supplied to the upstream side of the TMP 265. The TMP 265 exhausts the $N_2$ gas downstream. In this instance, a flow rate of the $N_2$ gas is controlled by the mass flow controller 293 so that the pressure of the $N_2$ gas exhausted from the TMP 265 is higher than the pressure of the exhaust pipe 264 (in other words, the exhaust pressure of the TMP 265 is higher than the pressure of the exhaust pipe reaching from the TMP 265 to the DP 272). Thus, back flow of the gas to the TMP 265 from the exhaust pipe 264 is prevented to prevent the operation of the TMP 265 from being unstable.

Next, operations of the valves of the exhaust system in each step of the film forming process will be described. In S202 (first processing gas supply process), the valve 270 and the valve 271 are opened, and the pressure of the processing space 201 is controlled to be a predetermined pressure by the APC 269. In addition, the valve 292 is also kept closed, and the $N_2$ gas is supplied to the TMP 265. In this instance, the flow rate of the $N_2$ gas is controlled by the mass flow controller 293 so that the pressure of the $N_2$ gas exhausted from the TMP 265 is higher than the pressure of the exhaust pipe 264 (pressure of the gas flowing into the exhaust pipe 264 through the exhaust pipe 263). In addition, other valves of the exhaust system are all closed.

Even when the shower head 230 and the processing space 201 are purged in S204 (purge process), the valve 270 and the valve 271 are kept opened, and controlled by the APC 269 so that the pressure of the processing space 201 is a predetermined pressure. In addition, the valve 292 is also kept opened, and the $N_2$ gas is supplied to the TMP 265. In this instance, the flow rate of the $N_2$ gas is controlled by the mass flow controller 293 so that the pressure of the $N_2$ gas exhausted from the TMP 265 is higher than the pressure of the exhaust pipe 264 (pressure of the gas flowing into the exhaust pipe 264 through the exhaust pipe 263). Other valves of the exhaust system are all closed.

Subsequently, when the shower head 230 is purged, the valve 268 is opened while the valve 270 and the valve 271 are closed. That is, the shower head 230 (buffer space 232) is exhausted by the DP 272 through the exhaust pipe 262 while the pressure control by the APC 269 is stopped. In addition, in this instance, the valve 270 downstream from the APC 269 may be opened. In addition, the valve 292 is also kept opened, and the $N_2$ gas is supplied to the TMP 265. In this instance, the flow rate of the $N_2$ gas is controlled by the mass flow controller 293 so that the pressure of the $N_2$ gas exhausted from the TMP 265 is higher than the pressure of the exhaust pipe 264 (pressure of the gas flowing into the exhaust pipe 264 through the exhaust pipe 262). Other valves of the exhaust system are all closed.

When purging of the shower head 230 is completed, blocking between the shower head 230 and the exhaust pipe 264 is performed by closing the valve 268 while the pressure control by the APC 269 restarts by opening the valve 270 and the valve 271. In addition, the valve 292 is also kept opened, and the $N_2$ gas is supplied to the TMP 265. In this instance, the flow rate of the $N_2$ gas is controlled by the mass flow controller 293 so that the pressure of the $N_2$ gas exhausted from the TMP 265 is higher than the pressure of the exhaust pipe 264 (pressure of the gas flowing into the exhaust pipe 264 through the exhaust pipe 263). Other valves of the exhaust system are all closed.

Even in S206 (second processing gas supply process) and S208 (purge process), the same operations as those in the processes (S202 and S204) are performed.

In S106 (substrate loading process), the valve 270 and the valve 271 are closed while the wafer 200 moves from the processing position up to the transfer position, thereby stopping the pressure control by the APC 269. Meanwhile, the transfer space 203 is exhausted by the DP 272 by opening the valve 261b. In addition, the valve 292 is also kept opened, and the $N_2$ gas is supplied to the TMP 265. In this instance, the flow rate of the $N_2$ gas is controlled by the mass flow controller 293 so that the pressure of the $N_2$ gas exhausted from the TMP 265 is higher than the pressure of the exhaust pipe 264 (pressure of the gas flowing into the exhaust pipe 264 through a bypass pipe 261a). Other valves of the exhaust system are all closed.

Subsequently, when the wafer 200 moves up to the transfer position, blocking between the transfer space 203 and the exhaust pipe 264 is performed by closing the valve 261b. Meanwhile, the atmosphere of the transfer space 203 is exhausted by the TMP 265 (and DP 272) by opening the valve 267. In addition, supply of the $N_2$ gas to the TMP is stopped by closing the valve 292.

As described above, in the second embodiment, when exhausting the processing container 202 through the exhaust system other than the exhaust system in which the TMP 265 is provided, the $N_2$ gas is supplied between the valve 267 and the TMP 265 while the valve 267 upstream from the TMP 265 in the exhaust pipe 261 is closed. By the TMP 265 exhausting the $N_2$ gas downstream, back flow of the gas from the exhaust pipe 264 to the TMP 265 is prevented to prevent the operation of the TMP 265 from being unstable.

In addition, failures such as breakage and the like are likely to be caused due to a large pressure difference in front of and behind the valve downstream from the TMP 265, but in the second embodiment, the valve downstream from the TMP 265 may be unnecessary, thereby reducing a probability of degradation of stability in the operation of the TMP 265.

In addition, the flow rate of the $N_2$ gas supplied to the upstream side of the TMP 265 may be set as a single value based on a maximum pressure of the exhaust pipe 264 which is predicted in the substrate processing process, and the flow rate thereof may be set for each process based on the flow rate of the gas supplied to the processing container 202 in each process and changed by the mass flow controller 293 for each process. In addition, when the transfer space 203 is exhausted by the TMP 265, the $N_2$ gas may always and continuously be supplied to the upstream side of the TMP 265 by opening the valve 292. In addition, also in the second embodiment, the valve 266 presented in the first embodiment may be provided downstream from the TMP 265, and opening and closing between the TMP 265 and the exhaust pipe 264 may be performed by the valve 266. In this case, when the inert gas is supplied between the valve 267 and the TMP 265, the valve 266 is opened. In addition, in this case, protection of the TMP 265 achieved by closing the valve 266 and protection of the TMP 265 achieved by supplying the inert gas may be appropriately used in combination. For example, when the pressure of the exhaust pipe 264 is at least a predetermined value due to a large flow rate of the gas supplied to the processing space 201, or when the gas continues to be supplied to the processing space 201 for a predetermined time or more, the TMP 265 may be protected by closing the valve 266, and when the pressure of the exhaust pipe 264 is less than a predetermined value or when a time for which the gas continues to be supplied to the processing space 201 is less than a predetermined time, the TMP 265 may be protected by supplying the inert gas.

The film forming technologies have been described above as various typical embodiments, but the present invention is not limited to such embodiments. For example, the present invention may also be applied to cases of performing other substrate processing such as film forming processing, diffusion processing, oxidation processing, nitridation processing, lithography processing, and the like rather than the thin film described above. In addition, the present invention may also be applied to other substrate processing apparatuses such as a thin film forming apparatus, an etching apparatus, an oxidation processing apparatus, a nitridation processing apparatus, a coating apparatus, a heating apparatus, and the like rather than an annealing processing apparatus. In addition, in the present invention, a mixture of these apparatuses may be used. In addition, configuration of other embodiments may be substituted for a part of the configuration of one embodiment, and also added to the configuration of the one embodiment. In addition, addition, deletion, and substitution of other configurations may be performed with respect to a part of the configuration of each embodiment.

According to the one or more embodiments of the invention set forth here, the operation of a vacuum pump provided in an exhaust system can be prevented from being unstable.

EXEMPLARY EMBODIMENTS

Exemplary embodiments of the present invention will be supplementarily described below.

[Supplementary Note 1]

According to one aspect of the present invention, there is provided a substrate processing apparatus configured to process a substrate by supplying a gas into a processing space, the apparatus including:

a buffer space wherein the gas is dispersed, the buffer space disposed at an upstream side of the processing space;

a transfer space where the substrate passes when the substrate is transferred to the processing space;

a first exhaust pipe connected to the transfer space;

a second exhaust pipe connected to the buffer space;

a third exhaust pipe connected to the processing space;

a fourth exhaust pipe connected to downstream sides of the first exhaust pipe, the second exhaust pipe and the third exhaust pipe;

a first vacuum pump disposed at the first exhaust pipe;

a second vacuum pump disposed at the fourth exhaust pipe;

a first valve disposed at the first exhaust pipe at a downstream side of the first vacuum pump;

a second valve disposed at the second exhaust pipe; and a third valve disposed at the third exhaust pipe.

[Supplementary Note 2]

It is preferable that the substrate processing apparatus of Supplementary note 1 further includes a control unit configured to control the first valve and the second valve such that the first valve is closed when the second valve is open.

[Supplementary Note 3]

In the substrate processing apparatus of Supplementary note 2, it is preferable that the control unit is configured to control the first valve and the first vacuum pump such that first vacuum pump continuously operates even when the first valve is closed.

[Supplementary Note 4]

It is preferable that the substrate processing apparatus of Supplementary note 2 or 3 further includes a fourth valve disposed at the first exhaust pipe at an upstream side of the first vacuum pump, wherein the control unit is configured to control the first valve and the fourth valve such that the first valve is closed after the fourth valve is closed.

[Supplementary Note 5]

In the substrate processing apparatus of any one of Supplementary notes 2 to 4, it is preferable that the control unit is configured to control the first valve and the third valve such that the first valve is closed when the third valve is open.

[Supplementary Note 6]

In the substrate processing apparatus of any one of Supplementary notes 1 to 5, it is preferable that the first vacuum pump includes a turbo molecular pump.

[Supplementary Note 7]

According to another aspect of the present invention, there is provided a substrate processing apparatus including:

a processing container accommodating a substrate to be processed;

a plurality of exhaust pipes connected to the processing container;

a first vacuum pump disposed at one of the plurality of exhaust pipes;

a second vacuum pump disposed at a downstream side of the plurality of exhaust pipes;

a valve disposed at the one of the plurality of exhaust pipes at an upstream side of the first vacuum pump; and an inert gas supply unit connected to the one of the plurality of exhaust pipes between the first vacuum pump and the valve.

[Supplementary Note 8]

It is preferable that the substrate processing apparatus of Supplementary note 7 further includes a control unit configured to control the valve and the inert gas supply unit such that the inert gas supply unit supplies an inert gas to the first vacuum pump when the valve is closed.

[Supplementary Note 9]

In the substrate processing apparatus of Supplementary note 8, it is preferable that the control unit is configured to control a flow rate of the inert gas supplied by the inert gas supply unit such that an exhaust pressure of the first vacuum pump is higher than an inside pressure of an exhaust pipe between the first vacuum pump and the second vacuum pump.

[Supplementary Note 10]

In the substrate processing apparatus of Supplementary note 9, it is preferable that the control unit is configured to control the flow rate of the inert gas supplied by the inert gas supply unit based on a flow rate of a gas supplied into the processing container.

[Supplementary Note 11]

According to still another aspect of the present invention, there is provided a method of manufacturing a semiconductor device by processing a substrate by supplying a processing space with a gas dispersed in a buffer space disposed at an upstream side of the processing space, the method including: transferring the substrate into the processing space while exhausting a transfer space of the substrate by a first vacuum pump and a second vacuum pump disposed at a downstream side of the first vacuum pump; closing a valve disposed between the downstream side of the first vacuum pump and an upstream side of the second vacuum pump; supplying the gas into the processing space via the buffer space; and exhausting the buffer space by the second vacuum pump through an exhaust pipe connected to the second vacuum pump at a downstream side of the valve.

[Supplementary Note 12]

According to yet another aspect of the present invention, there is provided a method of manufacturing a semiconductor device by processing a substrate by supplying a gas into a processing container, the method including: exhausting the processing container by a first vacuum pump disposed at one of a plurality of exhaust pipes connected to the processing container and a second vacuum pump disposed at a downstream side of the plurality of exhaust pipes; supplying an inert gas into the first vacuum pump by an inert gas supply unit connected to a portion of the one of the plurality of exhaust pipes is disposed between the first vacuum pump and a valve disposed at the one of the plurality of exhaust pipes at an upstream side of the first vacuum pump with the valve closed; supplying a gas into the processing container; and exhausting the processing container by the second vacuum pump through the plurality of exhaust pipes other than the one of the plurality of exhaust pipes.

[Supplementary Note 13]

According to further aspect of the present invention, there is provided a program for processing a substrate by supplying a processing space with a gas dispersed in a buffer space disposed at an upstream side of the processing space, the program causing a computer to execute: transferring the substrate into the processing space while exhausting a transfer space of the substrate by a first vacuum pump and a second vacuum pump disposed at a downstream side of the first vacuum pump; closing a valve disposed between the downstream side of the first vacuum pump and an upstream side of the second vacuum pump; supplying the gas into the processing space via the buffer space; and exhausting the buffer space by the second vacuum pump through an exhaust pipe connected to the second vacuum pump at a downstream side of the valve.

[Supplementary Note 14]

According to further aspect of the present invention, there is provided a program for processing a substrate by supplying a processing gas into a processing container, the program causing a computer to execute: exhausting the processing container by a first vacuum pump disposed at one of a plurality of exhaust pipes connected to the processing container and a second vacuum pump disposed at a downstream side of the plurality of exhaust pipes; supplying an inert gas into the first vacuum pump by an inert gas supply unit connected to a portion of the one of the plurality of exhaust pipes is disposed between the first vacuum pump and a valve disposed at the one of the plurality of exhaust pipes at an upstream side of the first vacuum pump with the valve closed; supplying a gas into the processing container; and exhausting the processing container by the second vacuum pump through the plurality of exhaust pipes other than the one of the plurality of exhaust pipes.

[Supplementary Note 15]

According to further aspect of the present invention, there is provided a non-transitory computer-readable recording medium storing a program for processing a substrate by supplying a processing space with a gas dispersed in a buffer space disposed at an upstream side of the processing space, the program causing a computer to execute: transferring the substrate into the processing space while exhausting a transfer space of the substrate by a first vacuum pump and a second vacuum pump disposed at a downstream side of the first vacuum pump; closing a valve disposed between the downstream side of the first vacuum pump and an upstream side of the second vacuum pump; supplying the gas into the processing space via the buffer space; and exhausting the buffer space by the second vacuum pump through an exhaust pipe connected to the second vacuum pump at a downstream side of the valve.

[Supplementary Note 16]

According to further aspect of the present invention, there is provided a non-transitory computer-readable recording medium storing a program for processing a substrate by supplying a processing gas into a processing container, the program causing a computer to execute: exhausting the processing container by a first vacuum pump disposed at one of a plurality of exhaust pipes connected to the processing container and a second vacuum pump disposed at a downstream side of the plurality of exhaust pipes; supplying an inert gas into the first vacuum pump by an inert gas supply unit connected to a portion of the one of the plurality of exhaust pipes is disposed between the first vacuum pump and a valve disposed at the one of the plurality of exhaust pipes at an upstream side of the first vacuum pump with the valve closed; supplying a gas into the processing container; and exhausting the processing container by the second vacuum pump through the plurality of exhaust pipes other than the one of the plurality of exhaust pipes.

What is claimed is:

1. A method of manufacturing a semiconductor device by processing a substrate by supplying a processing space with a processing gas dispersed in a buffer space disposed at an upstream side of the processing space, the method comprising:
    (a) transferring the substrate into the processing space while exhausting a transfer space of the substrate by a first vacuum pump;
    (b) closing a first valve disposed at a downstream side of the first vacuum pump;
    (c) supplying the processing gas into the processing space via the buffer space while exhausting the processing gas from the processing space through a third valve connected to the processing space;
    (d) exhausting an inner atmosphere of the processing space through the third valve by supplying a purge gas into the processing space via the buffer space with a second valve connected to the buffer space closed and a supply of the process gas into the processing space suspended; and
    (e) exhausting the buffer space through the second valve and an exhaust pipe connected to a downstream side of the first valve after performing (d) by supplying the purge gas into the buffer space with the third valve closed and the second valve open.

2. The method of claim 1, wherein (c) comprises (c-1) supplying a first processing gas and (c-2) supplying a second processing gas, and (d) and (e) are performed between (c-1) and (c-2).

3. The method of claim 1, wherein (b) is performed after closing a fourth valve disposed at an upstream side of the first vacuum pump after (a) is performed.

4. The method of claim 1, wherein (c) is performed while suspending the exhausting of the transfer space.

5. The method of claim 1, further comprising: exhausting the inner atmosphere of the processing space through the third valve after performing (e) by supplying the purge gas into the processing space with the second valve closed.

* * * * *